United States Patent [19]
Nakai et al.

[11] Patent Number: 5,917,354
[45] Date of Patent: Jun. 29, 1999

[54] CIRCUIT FOR RESETTING OUTPUT OF POSITIVE/NEGATIVE HIGH VOLTAGE GENERATING CIRCUIT TO VCC/VSS

[75] Inventors: Hiroaki Nakai; Shinichi Kobayashi; Masaaki Mihara, all of Hyogo, Japan

[73] Assignee: Mitsubishi Denki Kabushiki Kaisha, Tokyo, Japan

[21] Appl. No.: 08/868,974

[22] Filed: Jun. 4, 1997

Related U.S. Application Data

[63] Continuation of application No. 08/559,873, Nov. 20, 1995, abandoned.

[30] Foreign Application Priority Data

Nov. 29, 1994 [JP] Japan ..................................... 6-294836

[51] Int. Cl.⁶ ............................. H03K 17/20; G11C 16/06
[52] U.S. Cl. ......................... 327/198; 327/142; 327/541; 327/328; 307/75; 307/87; 365/185.23; 365/189.09
[58] Field of Search ................................. 307/43, 72, 75, 307/80, 85, 86, 87, 126, 130; 327/409, 410, 142, 143, 198, 374, 376, 377, 437, 534, 535, 536, 537, 546; 365/185.23

[56] References Cited

U.S. PATENT DOCUMENTS

| | | | |
|---|---|---|---|
| 4,937,787 | 6/1990 | Kobatake | 365/185.23 |
| 5,138,190 | 8/1992 | Yamazaki et al. | 327/536 |
| 5,296,765 | 3/1994 | Williams et al. | 327/379 |
| 5,341,329 | 8/1994 | Takebuchi | 365/185.23 |
| 5,357,476 | 10/1994 | Kuo et al. | 365/185.12 |
| 5,386,422 | 1/1995 | Endoh et al. | 365/185.23 |
| 5,400,287 | 3/1995 | Fuchigami | 365/185.23 |
| 5,513,146 | 4/1996 | Atsumi et al. | 365/185.23 |
| 5,550,494 | 8/1996 | Sawada | 365/185.23 |
| 5,592,430 | 1/1997 | Ohtsuki | 365/226 |
| 5,770,964 | 6/1998 | Suma | 327/327 |

*Primary Examiner*—Timothy P. Callahan
*Assistant Examiner*—Terry L. Englund
*Attorney, Agent, or Firm*—McDermott, Will & Emery

[57] ABSTRACT

When a state of outputting a third power supply potential to an output node is switched to a state of outputting a second power supply potential, connection between a supply unit of the second power supply potential and the output node is made through a first P-channel MOSFET. Further, when the first P-channel MOSFET is turned off, i.e., when the third power supply potential is output to the output node, the third power supply potential is also applied to a gate of the first P-channel MOSFET. Therefore, even when the potential of the output node rises to the third power supply potential, this transistor is not turned on. Thus, the second power supply potential and the output node are appropriately and electrically isolated from each other. The circuit can be used with a flash memory to prevent over programming.

25 Claims, 20 Drawing Sheets

CIRCUIT FOR RESETTING OUTPUT OF POSITIVE/NEGATIVE HIGH VOLTAGE GENERATING CIRCUIT TO VCC/VSS

This application is a continuation of application Ser. No. 08/559,873 filed Nov. 20, 1995, now abandoned.

BACKGROUND OF THE INVENTION

1. Field of the Invention

The present invention relates to a semiconductor device, and in particular to a reset circuit for switching an output voltage of an internal circuit which outputs an externally supplied power supply voltage or an internal voltage produced from the power supply voltage.

2. Description of the Background Art

In semiconductor devices such as a flash memory which perform electrical operations such as writing, reading and erasing of data, a plurality of voltages other than an externally supplied power supply voltage are internally generated and are used for the above operations.

For example, in the flash memory, each memory cell is formed of one transistor, of which drain and control gate are connected to a bit line and a word line, respectively. Erasing is performed in such a manner that a positive high voltage is applied to the control gate of the transistor forming the memory cell, and a negative high voltage is applied to a source and a P-well thereof, so that electrons are injected into a floating gate utilizing a tunnel phenomenon. Writing is performed in such a manner that a negative high voltage is applied to the control gate, and a positive high voltage is applied to the drain, so that electrons are removed from the floating gate utilizing the tunnel phenomenon.

Description will now be given on the internal voltages used for various operations of the conventional flash memory. FIG. 19 shows various voltages supplied to memory cells in selected and unselected sectors during various operation states of the flash memory.

For example, as shown in FIG. 19, when erasing is performed in the selected sector, a source voltage $V_s$ is −8V, a control gate voltage $V_{cg}$ is 10V, a P-well voltage BG is −8V and a drain voltage $V_d$ is floated (Z). Likewise, memory cells in the selected and unselected sectors are supplied with source voltage $V_s$, control gate voltage $V_{cg}$, drain voltage $V_d$ and P-well voltage BG of predetermined values in the respective operation modes, so that the respective operations are performed.

In the structure that only the power supply voltage of 3V is externally supplied, voltages of 6V, 10V, 4V, −8V and −4V must be produced from this power supply voltage. For this purpose, the flash memory is generally and internally provided with a positive voltage generating circuit and a negative voltage generating circuit including charge pump circuits.

Description will be give further specifically on the erase and write operations which are performed on the memory cell using the above positive voltage generating circuit and negative voltage generating circuit.

As described before, the erased state of the memory cell is achieved when the injected electrons exist in the floating gate. Therefore, a threshold voltage of the memory cell transistor in the erased state is shifted to the positive as compared with the case where electrons are not injected.

In the operation of reading stored information from the memory cell of flash memory, a constant voltage is applied to the control gate in the operation mode that the source is grounded and a positive voltage about IV is applied to the drain, and the stored information is determined by sensing whether a certain current flows between the source and drain or not. The current does not flow in the transistor of which threshold voltage was positively shifted by the erase operation, when the read operation is performed.

Description will now be given on an operation of erasing stored information and newly writing storage information into the flash memory.

FIG. 20 is a graph in which an abscissa represents the threshold voltage of the transistor in the memory cell, and an ordinate represents the number of the transistors in the chip having corresponding threshold voltage, i.e., the number of bits.

Writing of new storage information is generally performed after erasing the storage information of the memory cells in the blocks to be under the writing procedure by the reason which will be detailed later.

Description will now be given on the write operation. In the following description, such a state is called a start state that the above erasing is performed on the bits to be under the writing procedure.

In the start state, the threshold voltages of transistors of memory cells in the blocks are distributed such that the central value is positively shifted as shown at A in FIG. 20.

In this state, it is attempted to perform writing, i.e., programming on transistors corresponding to the bits to be written. In this case, the gate is maintained at a negative potential (−14V) with respect to the drain, so that electrons are removed from the floating gate into the drain. As the removal progresses, distribution of threshold values of the transistors corresponding to the written bits changes to move from A through B and C to D in FIG. 20.

However, if this state were maintained as it was, all electrons would be removed from the floating gate, and further, the threshold voltages would be shifted to a negative value. This state corresponds to the state E in FIG. 20.

Thus, in the transistor of memory cell, a current would flow between the source and drain, even if 0V were applied to the gate.

This means the following. As indicated at a lower portion in FIG. 19, even if 0V is set at the gate in order to deselect the memory cell, a high impedance state (represented by a character Z in FIG. 19) is not achieved between the source and drain, and a leak current occurs through the cell. This results in difficulty of correctly reading the information of the selected memory cell. This state is called an over-programming state.

In the actual programming, the voltage in the form of pulse is applied across the gate and drain for the writing so as to prevent the above over-programming.

Procedure for the above will be described below with reference to FIGS. 20 and 19. If writing were performed on the bit which had already been programmed, over-programming would occur. It is necessary, therefore, to perform program verify on all bits for setting an initial state.

Thereafter, pulses for program writing are applied and then the programmed state is verified.

For example, after the first pulse application to transistors of which threshold values are distributed as indicated by A in FIG. 20, the threshold values of the transistors corresponding to the written bits are distributed as indicated by B.

If the threshold values do not change sufficiently, pulses are applied again. This procedure corresponds to the steps of program pulse application and program verify in FIG. 21, and is repeated until the threshold values of the programmed bits attain an appropriate value.

By the above procedure, distribution of the threshold values of transistors corresponding to the programmed bits changes from the state indicated at B in FIG. 20 through the state indicated by C into the state indicated by D. At this time, writing of program is finished.

Description will now be given briefly on the operation of conventional flash memory with reference to the drawings.

FIG. 18 is a block diagram showing a structure of the conventional flash memory.

In FIG. 18, a memory cell array in one sector is shown in a simplified form of a 2×2 structure for the sake of simplicity.

A write/erase control circuit 1 controls timings of write and erase operations as well as voltages for respective operations. Data I/O buffer 2 externally outputs data sent from a sense amplifier 3, and supplies the externally input write data to a write circuit 4. Sense amplifier 3 amplifies data of a memory cell in a memory cell array 11, which is sent via Y-gate transistors Q1 and Q2, and outputs the same to data I/O buffer 2.

Write circuit 4 supplies data, which is sent from data I/O buffer 2, to column latches 17 and 18. A column decoder 5 receives an output of an address buffer 13 to select Y-gate transistors Q1 and Q2. A 6V generating circuit 6 supplies a voltage of 6V to column latches 17 and 18, which supply 6V to bit lines in response to data of "0".

A −4V generating circuit 7 supplies a voltage of −4V to sources of unselected memory cells during an erase operation. A −8V generating circuit 8 supplies a voltage of −8V to word lines and a row decoder 12 during a write operation, and supplies a voltage of −8V to P-wells and sources of selected memory cells during the erase operation.

A select gate decoder 9 receives the output of address buffer 13 to select gates Q7–Q10 in memory cell array 11. A source line driver 10 includes N-channel MOSFETs Q3–Q6. Source line driver 10 applies a voltage at a ground level to a source line of the memory cell in the read operation, and applies a negative voltage thereto in the erase operation.

Memory cell array 11 includes memory cells Q11–Q18 and select gates Q7–Q10. In memory cell array 11, data is written into or erased from the memory cell selected by row decoder 12 and column decoder 5. Row decoder 12 receives an output from address buffer 13 to select a specific word line. Address buffer 13 receives an externally supplied address signal selecting a specific memory cell in memory cell array 11, and outputs a column address signal and a row address signal to column decoder 5 and row decoder 12, respectively.

A reference voltage generating circuit 14 supplies a word line voltage during write verifying, and supplies a reference voltage for 6V, 10/4V, −8V and −4V generating circuits 6, 19, 8 and 7. A well potential switching circuit 15 applies a negative high voltage to the P-well during erasing of the memory cell, and grounds the P-well in the other operation modes.

A transfer gate 16 controls connection between column latches 17 and 18 and the bit lines. Column latches 17 and 18 latch the write data in the write operation. 10/4V generating circuit 19 supplies a voltage of 10V to select gate decoder 9 in the write operation, supplies a voltage of 10V to the word line and row decoder 12 in the erase operation, and supplies a voltage of 4V to the word line and row decoder 12 in the erase verify operation. A verify control circuit 20 controls operations of respective circuits in the verify operation.

Since programming is performed in the flash memory as described above, the positive high voltage generating circuit for producing a positive voltage higher than the power supply voltage, which is used for the programming, as well as the negative high voltage generating circuit are required not only to hold a constant voltage during application of pulses in the program writing and erasing operations but also to satisfy the following three points.

First, when a pulse falls, the potential of the output line must restore the original potential rapidly, while not applying excessive stress to the transistors. Reduction in time necessary for the restoring leads to reduced time necessary for programming and reduced time necessary for erasure.

Assume that there is not a circuit for resetting the potential of the output line. Then, the potential of the output line would be maintained as it is even after the high voltage generating circuit stops its operation, or the potential of the output line lowers very slowly because of small leakage. When the state of the memory cell transistor changes from this state to the next operation step, the transistor would be subjected to extremely heavy stress, and the information stored in the memory cell would be disturbed. Therefore, there would be problems in reliability. In other words, unless the potential of the output line is reset, the state of operation of the memory cell transistor can not be changed.

Secondly, in the operation of the reset circuit resetting the high voltage on the output line, it is necessary to prevent the high voltage from being applied to the transistors constituting the high voltage reset circuit. In addition, in order to further improve reliability of the reset circuit, a structure in which the high voltage is not applied to the aforementioned transistors no matter whether the transistors are on or off is desirable.

Third, simplification of the circuit structure is required. This does not merely mean reduction of the number of transistors. For example, if it is necessary to provide transistors of which threshold voltage is different from that of transistors used in other circuits on the chip, this increases the number of manufacturing steps.

This will be detailed below in connection with the conventional structure.

FIG. 16 is a schematic block diagram showing the conventional positive high voltage generating circuit 101, which corresponds to 6V generating circuit 6 and 10V/4V generating circuit 19 in FIG. 18.

In FIG. 16, a booster circuit 103 is formed of an oscillator 104 and a positive voltage charge pump 105. Oscillator 104 outputs a pulse wave φ and its inverted wave /φ, and in response to them, positive voltage charge pump circuit 105 outputs a voltage $V_{pp}$ boosted from power supply voltage $V_{cc}$ to its output terminal 106.

In the reset operation, a reset signal RS changes from the L-level to the H-level, and oscillator 104 stops its operation.

Simultaneously, an N-channel MOSFET tn3 connected between output terminal 106 and the power supply is turned on in response to reset signal RS, and resets the output terminal voltage to voltage $V_{cc}$.

If N-channel MOSFET tn3 is of an enhancement type, i.e., the same type as transistors in other circuits on the chip and has a threshold value of $V_{thn}$, a potential $V_{out}$ supplied to output 106 can be expressed as follows:

$$V_{out} = V_{cc} - V_{thn}$$

Therefore, the output voltage drops by the threshold voltage, and a sufficient voltage cannot be obtained at the output.

If N-channel MOSFET tn3 is of a depletion type, voltage drop does not occur, but the transistor of depletion type increases the number of manufacturing steps, which increases the number of manufacturing steps and the cost of the chip.

FIG. 17 is a schematic block diagram showing a conventional negative high voltage generating circuit 201, which corresponds to −4V generating circuit 7 and −8V generating circuit 8 in FIG. 18.

In FIG. 17, a negative booster circuit 203 is formed of an oscillator 204 and a negative charge pump 205. Negative booster circuit 203 differs from the positive high voltage generating circuit in that a P-channel MOSFET tp3 is connected between an output terminal 206 and the ground, and that MOSFET tp3 and oscillator 204 are controlled by an inverted signal /RS of reset signal RS.

Also in this case, if P-channel MOSFET tp3 is of the enhancement type, a sufficient ground potential cannot be supplied. If it is of the depletion type, the number of manufacturing steps increases.

SUMMARY OF THE INVENTION

An object of the invention is to provide a circuit which can reset an output line held at a positive or negative high voltage to a potential equal to an external power supply potential, and which can be manufactured without increasing the number of manufacturing steps.

Another object of the invention is to provide a reset circuit which can weaken an electric field applied to a transistor during resetting therein and has high reliability.

Accordingly, the invention provides a reset circuit being externally supplied with a first power supply potential, a second power supply potential higher than the first power supply potential and a third power supply potential higher than the second power supply potential, and switching a state of outputting the third power supply potential to an output node to a state of outputting the second power supply potential in response to an external signal switchable between potentials at first and second signal levels, including a first input node, a second input node, a third input node, a control circuit, a first P-channel MOSFET and the output node. The first input node is supplied with the first power supply potential. The second input node is supplied with the second power supply potential. The third input node is connected to an output of a supply unit selectively stopping and starting supply of the third power supply potential in accordance with the external signal. The control circuit selectively outputs the first power supply potential and the third power supply potential in accordance with the potential level of the external signal. The first P-channel MOSFET receives on its gate the output of the control circuit and is connected at its drain to the second input node. The output node is connected to the third input node as well as a source and a back gate of the first P-channel MOSFET.

According to another aspect of the invention, the control circuit includes a second P-channel MOSFET receiving on its gate the external signal and connected at its source and back gate to the output node, a resistance connected at its one end to a drain of the second P-channel MOSFET and connected at the other end to the gate of the first P-channel MOSFET, and an N-channel MOSFET receiving on its gate the control signal, connected at its source and back gate to the first input node and connected at its drain to the other end of the resistance.

According to still another aspect of the invention, a reset circuit being externally supplied with a first power supply potential and a second power supply potential of a negative value lower than the first power supply potential, and switching a state of outputting the second power supply potential to an output node to a state of outputting the first power supply potential in accordance with an external signal switchable between potentials at first and second signal levels, includes a first input node, a second input node, a control circuit, a first N-channel MOSFET and an output node. The first input node is supplied with the first power supply potential. The second input node is connected to an output of a supply unit stopping and starting supply of the second power supply potential in accordance with the external signal. The control circuit selectively outputs the first and second power supply potentials in accordance with a potential level of the external signal. The first N-channel MOSFET receives on its gate an output of the control circuit, and is connected at its source to the first input node. The output node is connected to the second input node as well as a drain and a back gate of the first N-channel MOSFET.

Since resetting of the power supply potential of a positive voltage applied to the output node is performed through the first P-channel MOSFET, the potential of the output node does not drop a value corresponding to the threshold voltage, which is a major advantage of the invention.

Further, the potential of the signal turning off the first P-channel MOSFET is formed of the third power supply potential, so that this transistor is not turned on even when the potential of the output node attains the third power supply potential, and the output node is appropriately isolated from the second power supply potential.

Another advantage of the invention is that the resistance is additionally provided for reducing a voltage applied to a transistor in the control circuit driving the first P-channel MOSFET.

Therefore, the invention can provide the positive voltage reset circuit which can suppress a high electric field in the transistor and thus can have high reliability.

Still another advantage of the invention is as follows. Resetting of the power supply potential of the negative voltage applied to the output node is performed through the first N-channel MOSFET. Therefore, the potential of the output node does not rise a value corresponding to the threshold voltage.

Further, a potential of the signal turning off the first N-channel MOSFET is the second power supply potential which is negative, so that this transistor is not turned on even when the potential of the output node attains the second power supply potential, and the output node is appropriately isolated from the first power supply potential.

Yet another advantage of the invention is as follows. Since the circuits can be formed of only the enhancement type transistors, it is possible to prevent increase of the number of manufacturing steps, which is unavoidable if the depletion type transistors are to be manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A reset circuit of an embodiment of the invention will be described below with reference the drawings.

Although the prior art has been described in connection with the reset circuit for the high voltage generating circuit in the flash memory, the invention can be applied similarly to another type of semiconductor device in which an intended voltage is generated by a charge pump circuit.

Figure 1:
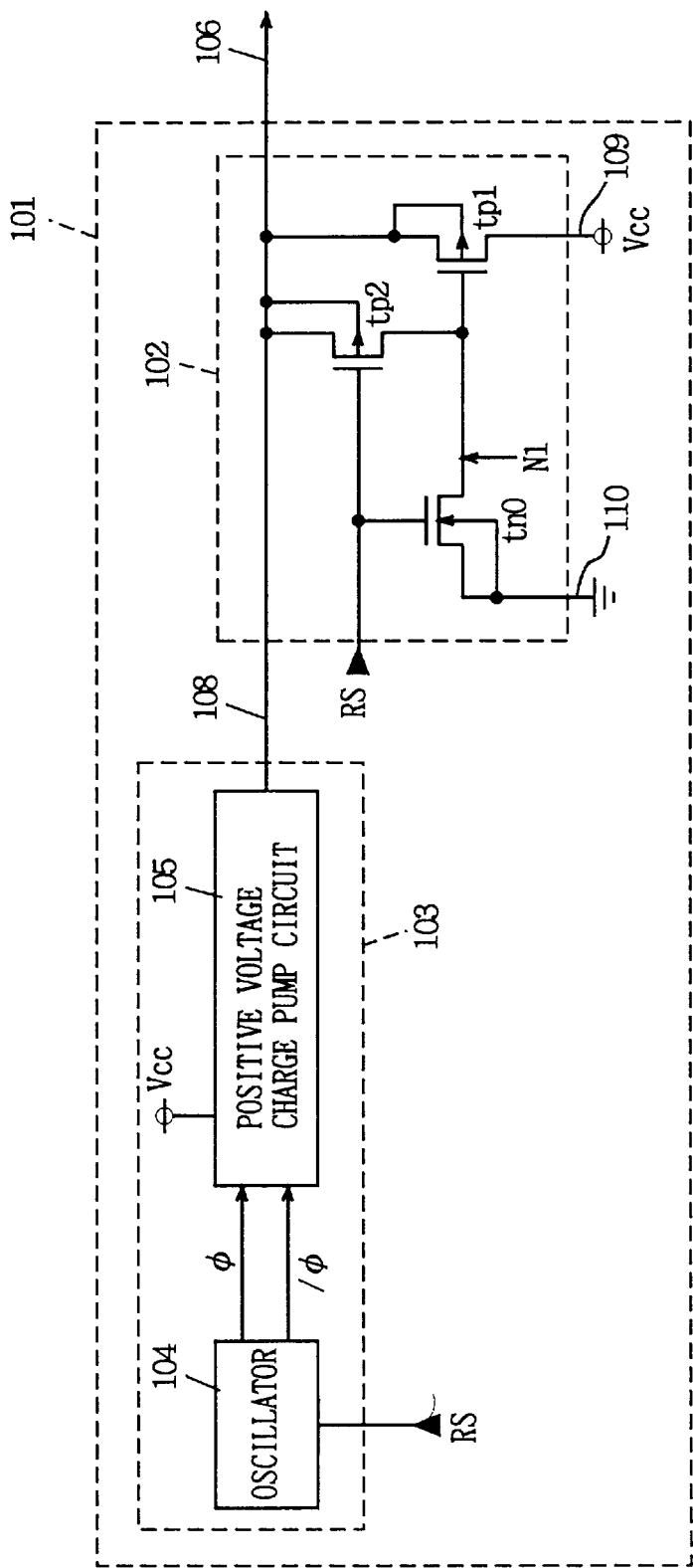
FIG. 1 is a schematic block diagram showing a first embodiment of the invention.
Figure 2:
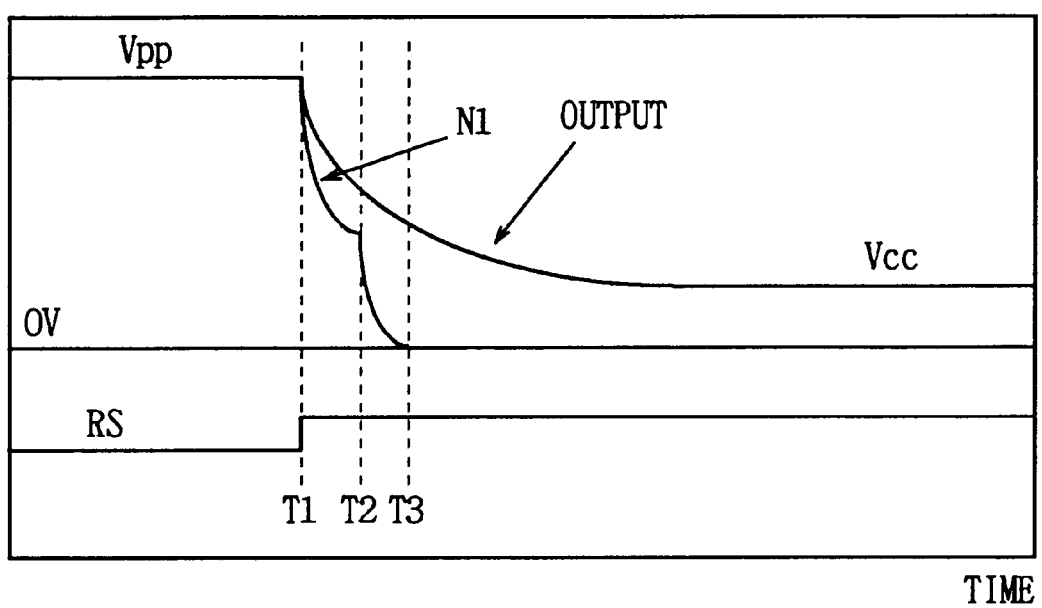
FIG. 2 shows potential change during operation of the first embodiment.

FIG. 1 is a schematic block diagram showing a structure of a positive high voltage generating circuit 101 according to an embodiment of the invention. FIG. 2 shows change of voltages in the reset operation of the embodiment in FIG. 1.

Figure 16:
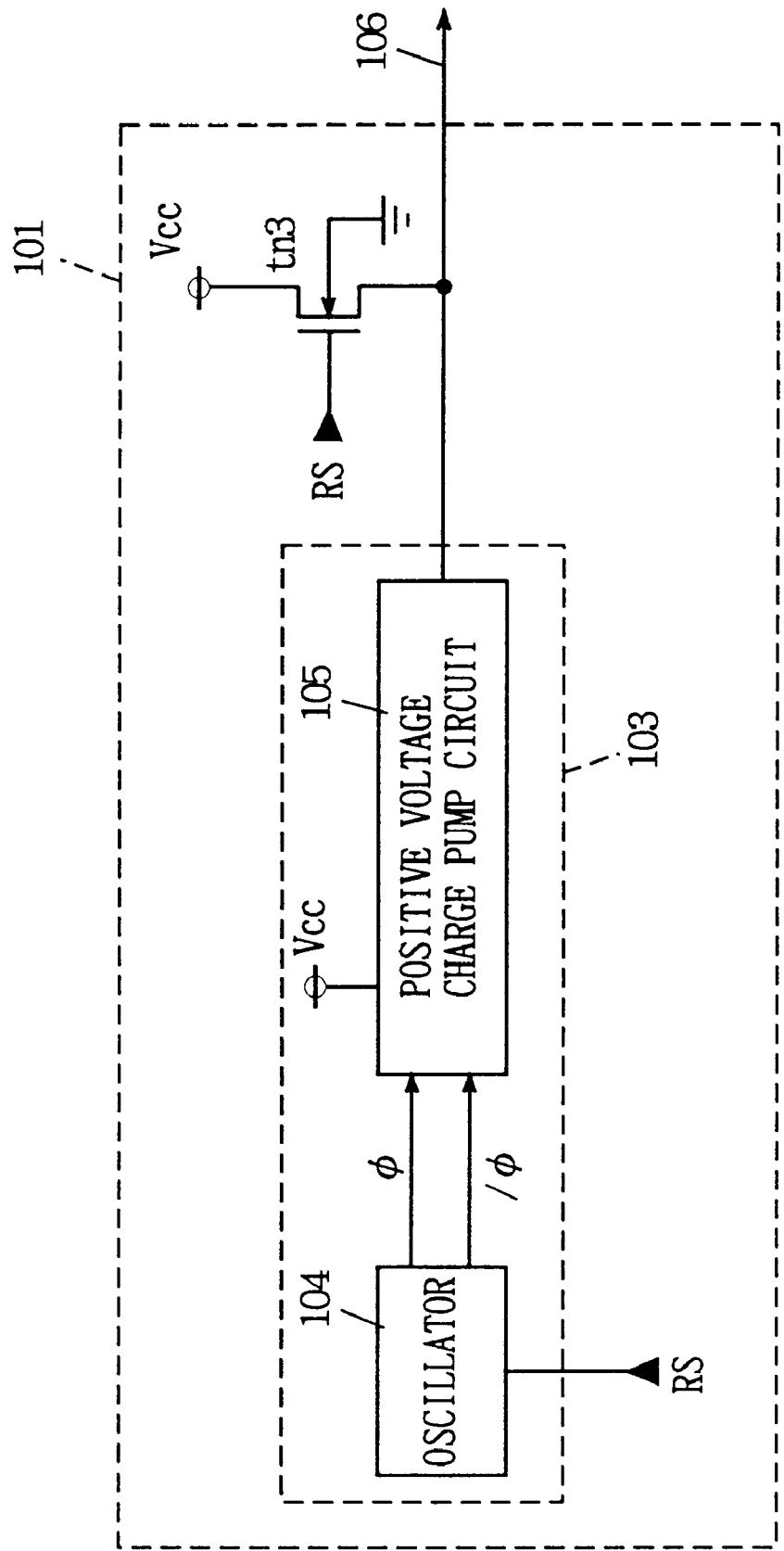
FIG. 16 is a schematic block diagram showing a structure of a positive high voltage generating circuit in the prior art.

In FIG. 1, an oscillator 104, a positive voltage charge pump 105 and others have the same structures as those in the prior art shown in FIG. 16.

In a positive high voltage reset circuit 102, a P-channel MOSFET tp1 is connected between an output terminal 106 and a supply unit of a second power supply potential equal to $V_{cc}$.

A second P-channel MOSFET tp2 and an N-channel MOSFET tn0 have drains connected together in series. These transistors are connected between output terminal 106 and a first power supply potential (i.e., ground potential) and are arranged such that a source of P-channel MOSFET tp2 is connected to the output terminal 106 and a source of N-channel MOSFET tn0 is connected to the ground.

Charge pump 105 produces a positive high voltage $V_{pp}$ from power supply potential $V_{cc}$. At this time, a reset signal RS is at "L" level. N-channel MOSFET tn0 is off, and P-channel MOSFET tp2 is on. The level of $V_{pp}$ is transmitted to a node N1 through P-channel MOSFET tp2, so that P-channel MOSFET tp1 is cut off.

This suppresses coupling between power supply potential $V_{cc}$ and output terminal 106 through P-channel MOSFET tp1. When reset is to be done, signal RS attains "H" level, so that N-channel MOSFET tn0 is turned on. Thereby, the level of node N1 lowers, so that P-channel MOSFET tp1 is also turned on.

P-channel MOSFET tp2 has been on. Therefore, output $V_{pp}$ starts to gradually lower its level.

The foregoing is expressed by waveforms between T1 and T2 in FIG. 2. T1 indicates a time at which reset signal RS attains "H" level, and T2 indicates a time at which P-channel MOSFET tp2 starts to be turned off as will be described later.

When the output changes to a value near $V_{cc}$, P-channel MOSFET tp2 starts to be turned off. Thereby, node N1 is rapidly discharged to the ground level by N-channel MOSFET tn0 (during a period between T2 and T3). Since N1 is grounded, P-channel MOSFET tp1 is sufficiently turned on, and $V_{cc}$ level is supplied to the output. Thus, it is possible to supply sufficiently the second power supply potential, i.e., $V_{cc}$ level to the output without using a depletion transistor.

Also, it is possible to prevent increase of the steps for manufacturing, because P-channel MOSFET tp1 can be of an enhancement type.

Figure 3:
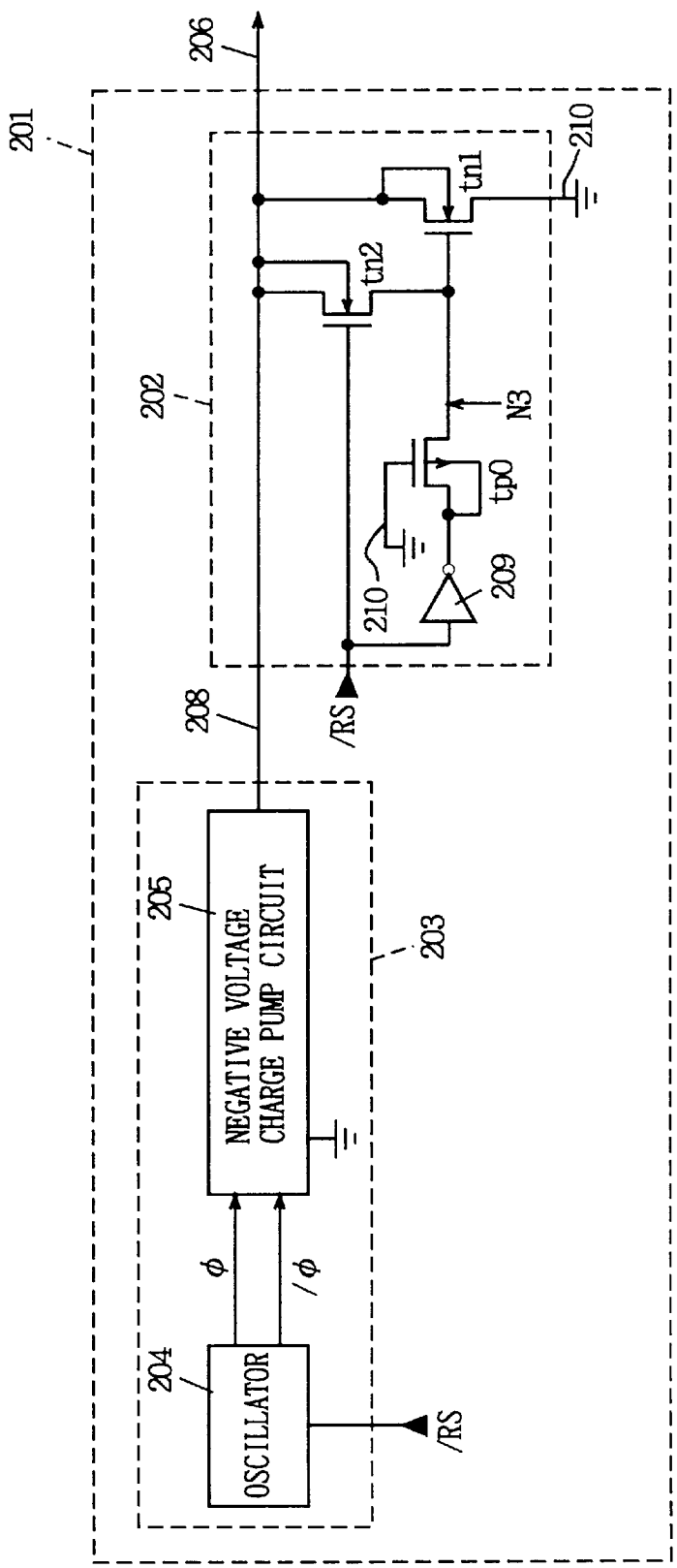
FIG. 3 is a schematic block diagram showing a second embodiment of the invention.

FIG. 3 is a schematic block diagram showing a structure of a negative high voltage generating circuit 201 of a second embodiment of the invention.

Figure 17:
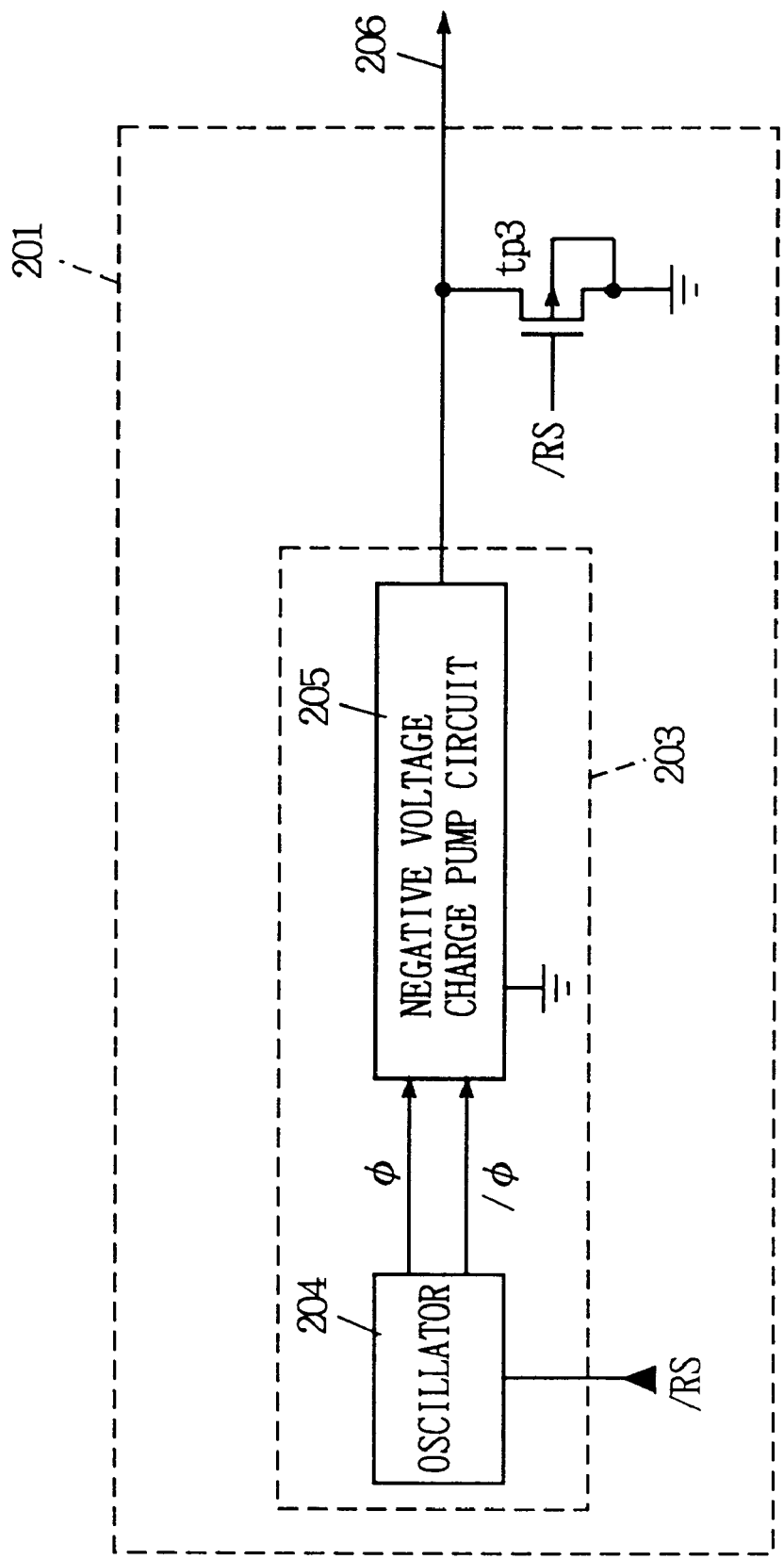
FIG. 17 is a schematic block diagram showing a structure of a negative high voltage generating circuit in the prior art.
Figure 18:
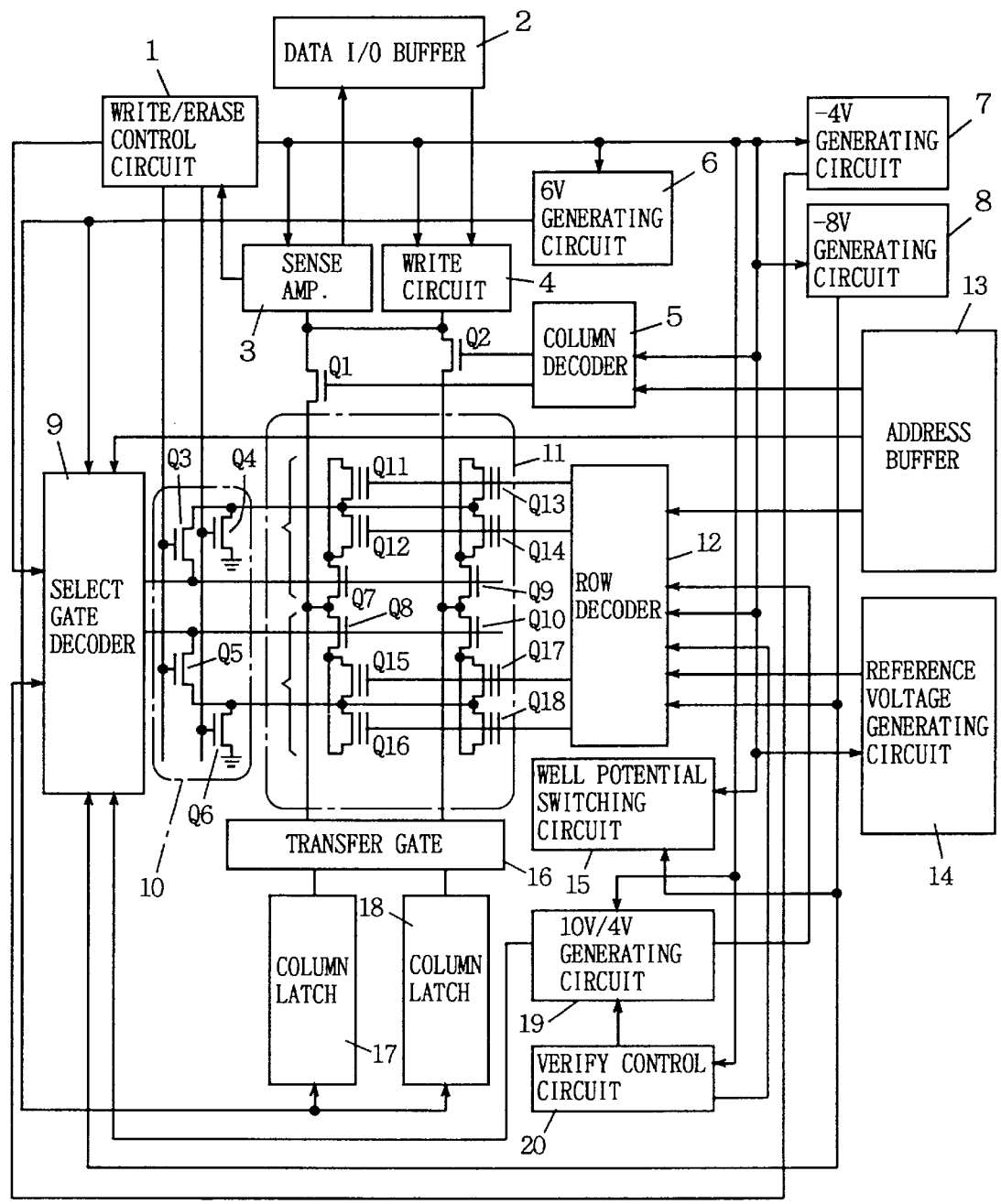
FIG. 18 is a schematic block diagram showing a structure of a flash memory in the prior art.
Figure 19:
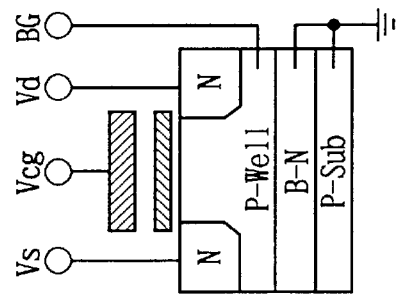
FIG. 19 shows erase, write and read operations performed on a memory cell in the flash memory.
Figure 20:
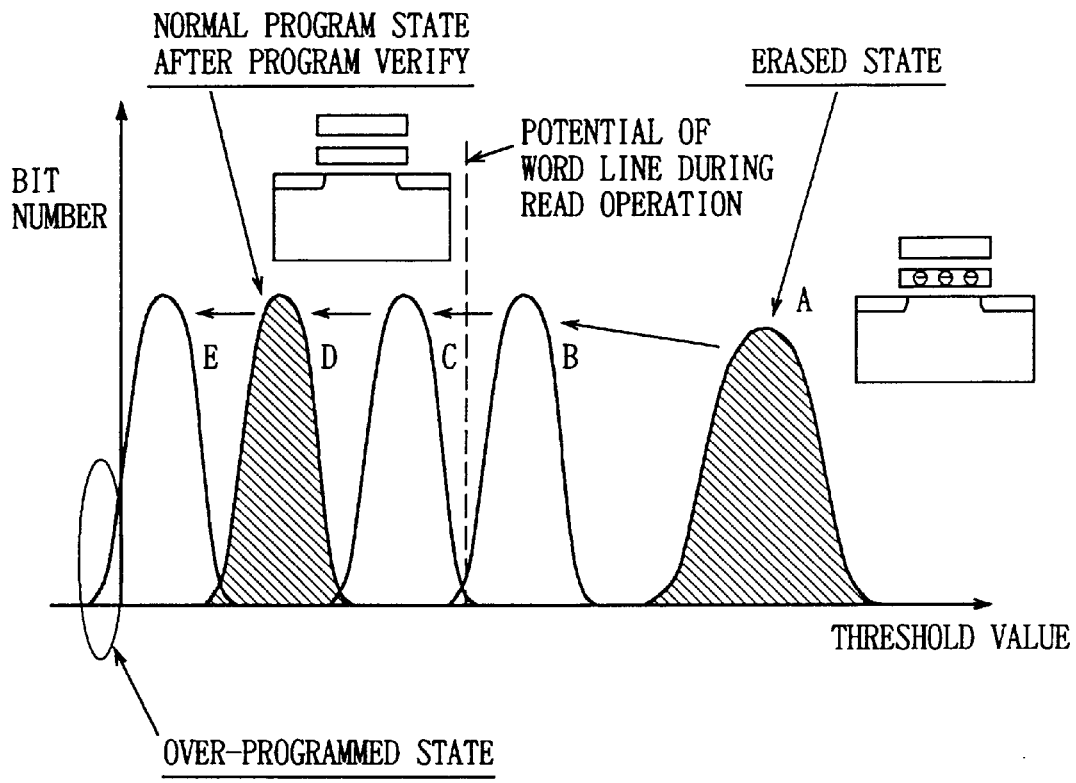
FIG. 20 shows progress of a write program for the flash memory.
Figure 21:
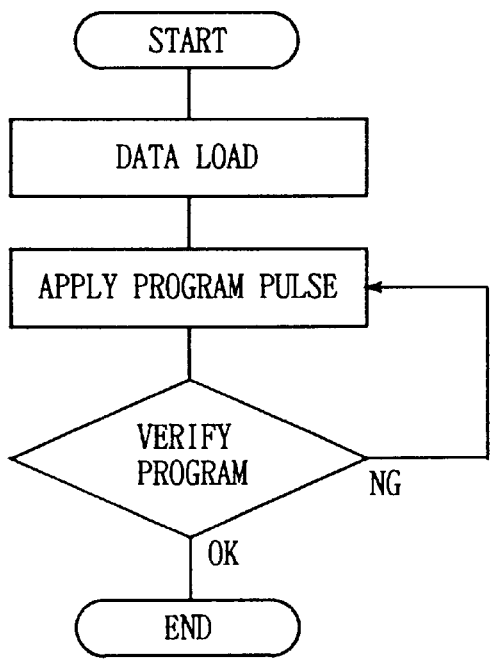
FIG. 21 shows a sequence of the write program for the flash memory.

In FIG. 3, an oscillator 204, a negative voltage charge pump 205 and others have the same structure as those in the prior art shown in FIG. 17.

Figure 4:
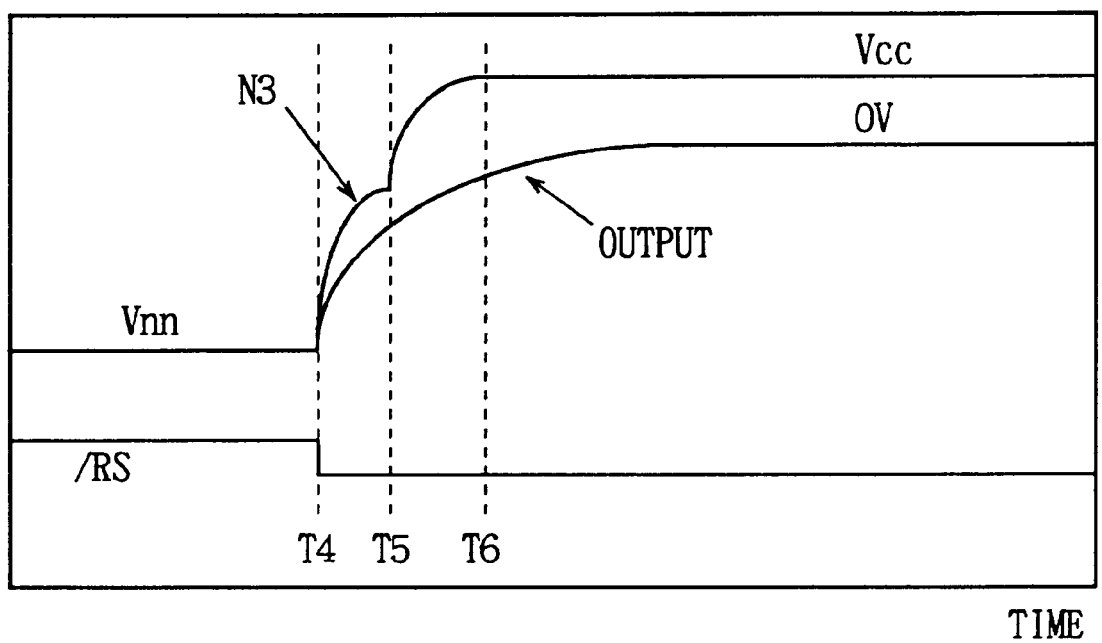
FIG. 4 shows potential change during operation of the second embodiment.

FIG. 4 shows voltage changes during the reset operation of the embodiment in FIG. 3.

In a negative high voltage reset circuit 202, an N-channel MOSFET tn1 is connected between an output terminal 206 and a first power supply voltage (ground potential).

A second N-channel MOSFET tn2 and a P-channel MOSFET tp0 have drains connected together in series. These transistors are arranged such that a source of second N-channel MOSFET tn2 is connected to an output terminal 206 and a source of P-channel MOSFET tp0 is connected to an output of an inverter circuit receiving an inverted signal of a reset signal.

The second N-channel MOSFET tn2 receives on its gate an inverted signal of the reset signal, and P-channel MOSFET tp0 receives on its gate a signal always maintaining the L-level (ground potential). A drive signal is supplied from a connection between these transistors to the gate of first N-channel MOSFET tn1.

While the output of charge pump 205 is high voltage $V_{nn}$, reset signal /RS is at "H" level. In this state, N-channel MOSFET tn2 is on and transmits $V_{nn}$ level of second power supply potential to a node N3.

Since $V_{nn}$ is a negative voltage, P-channel MOSFET tp0 is turned off. Therefore, the gate of N-channel MOSFET tn1 attains $V_{nn}$, so that N-channel MOSFET tn1 is also cut off, and thus the ground level is not transmitted to output terminal 206.

When reset is to be done, signal /RS attains "L" level. At this time, P-channel MOSFET tp0 is turned on to raise gradually the level of node N3, so that N-channel MOSFET tn1 is turned on.

N-channel MOSFET tn2 has been on. Therefore, the level of output $V_{nn}$ starts to rise gradually. This corresponds to the state between T4 and T5 in FIG. 4. T4 indicates a time at which reset signal /RS attains "L" level, and T5 indicates a time at which N-channel MOSFET tn2 is turned off as will be described later.

When output $V_{nn}$ changes to a value near the ground level, N-channel MOSFET tn2 is turned off. Thereby, node N3 rapidly rises to $V_{cc}$ level, so that N-channel MOSFET tn1 is sufficiently turned on to supply the ground level to output terminal 206. This corresponds to a period between T5 and T6. Similarly to the former embodiment, this embodiment can supply the ground level to the output without using a depletion transistor.

Also, it is possible to prevent increase of the steps for manufacturing, because N-channel MOSFET tn1 can be of an enhancement type.

Figure 5:
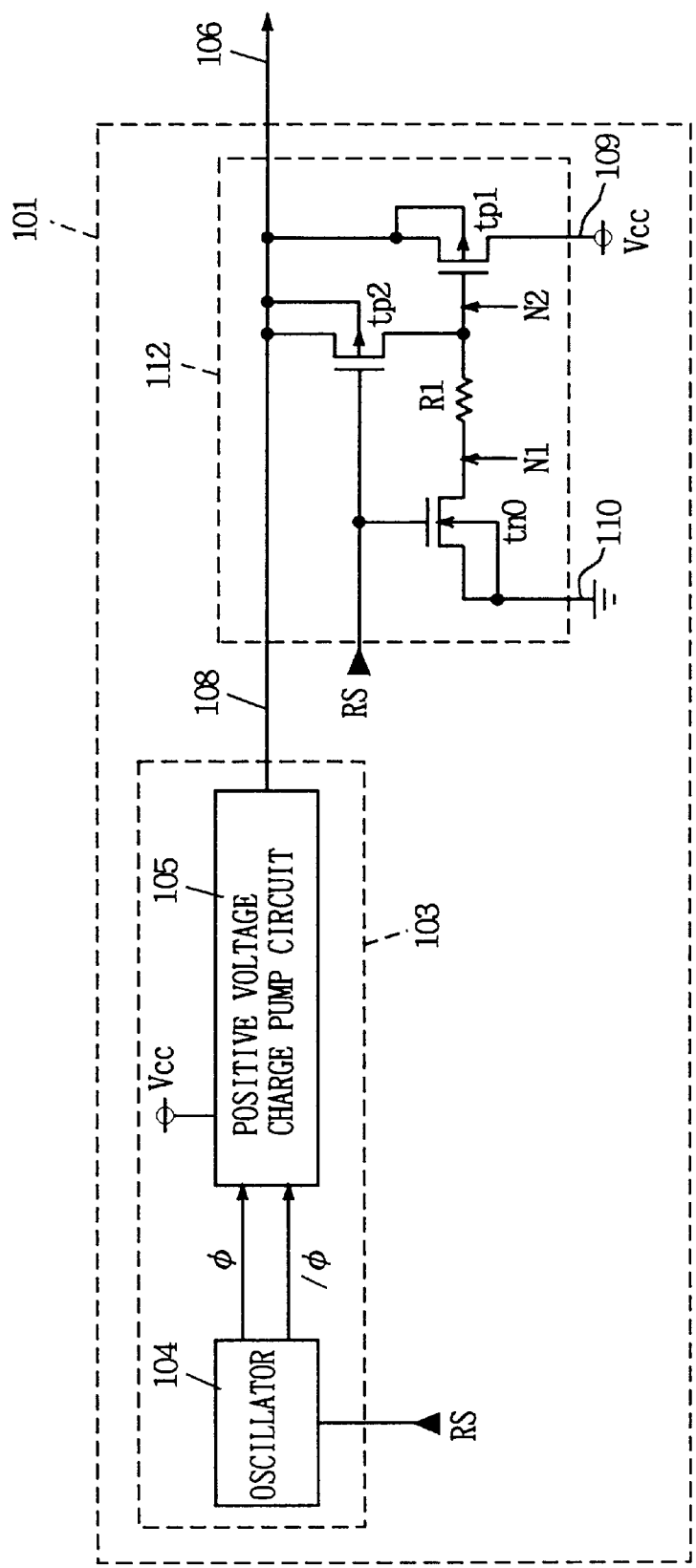
FIG. 5 is a schematic block diagram showing a third embodiment of the invention.

FIG. 5 is a schematic block diagram showing a structure of a positive high voltage generating circuit 101 of a third embodiment of the invention.

Figure 6:
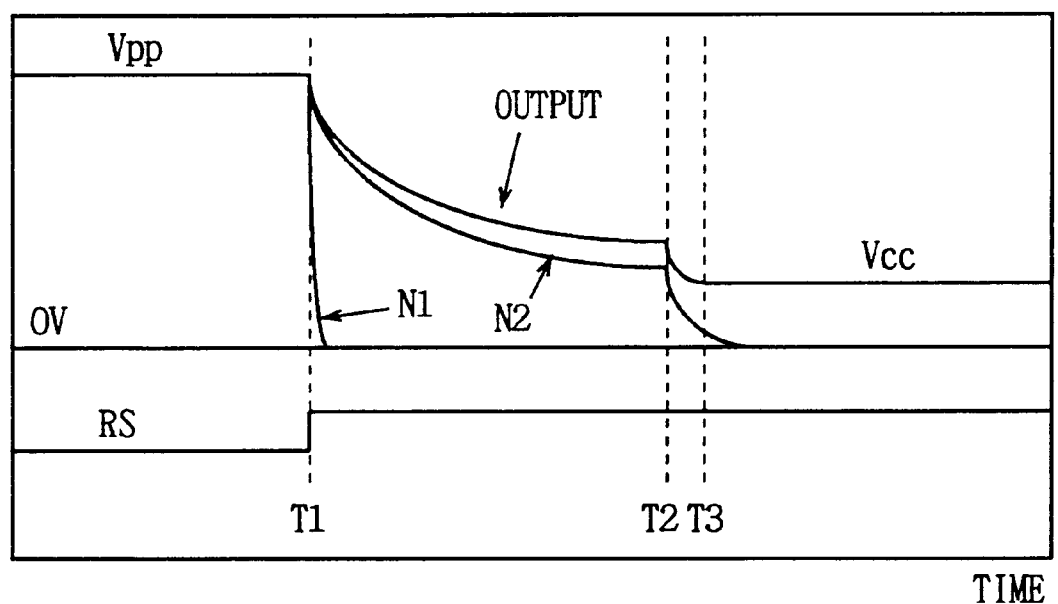
FIG. 6 shows potential change during operation of the third embodiment.

FIG. 6 shows voltage changes during the reset operation thereof.

The first embodiment is constructed to flow a discharge current during resetting while applying a relatively large voltage to N-channel MOSFET tn0 and P-channel MOSFETs tp1 and tp2. However, while a transistor is on and a current is flowing therethrough, such a malfunction, of which mechanism has been known, may be caused that a substrate current occurs at a drain portion to raise the potential level of the substrate, so that a bipolar operation occurs between the source, substrate and drain, and thus generates a large current.

In order to avoid the above, it is important not to apply a large voltage across the source and drain of the turned-on transistor.

By this reason, the embodiment in FIG. 5 employs a resistor R1 interposed between N-channel MOSFET tn0 and P-channel MOSFET tp2.

The operation generating a high voltage at output terminal 106 is similar to that of the first embodiment.

In the reset operation (i.e., when signal RS is at "H" level), the potential of node N1 instantaneously falls to the ground level when N-channel MOSFET tn0 is turned on, because resistor R1 is interposed. Although the potential of node N2 gradually falls through resistor R1, resistor R1 is set to reduce a potential difference between $V_{pp}$ and N2 to a very small value, which is not higher than the threshold value of P-channel MOSFET tp1.

Therefore, while P-channel MOSFET tp2 is on, P-channel MOSFET tp1 is off. This corresponds to a period between T1 and T2 in FIG. 6.

When $V_{pp}$ changes to a value near $V_{cc}$, P-channel MOSFET tp2 starts to be turned off. A discharging system formed of N-channel MOSFET tn0 and resistor R1 lowers the potential of node N2 to the ground level. At this time, P-channel MOSFET tp1 which has been off is turned on to supply $V_{cc}$ level to the output. This corresponds to a period between T2 and T3 in FIG. 6.

According to the method described above, a high voltage is not applied across the source and drain of the transistor which is on even during the reset operation, and thus resetting can be performed stably and reliably.

Figure 7:
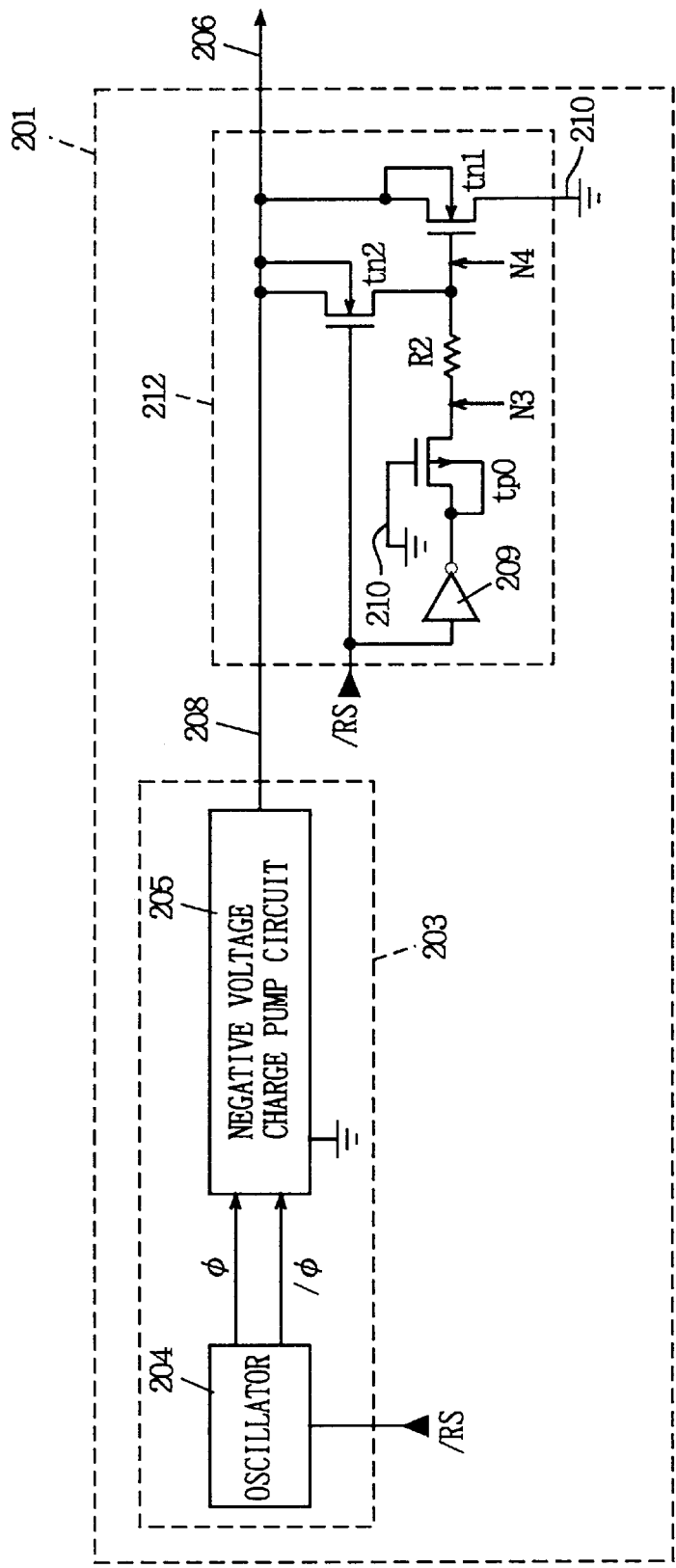
FIG. 7 is a schematic block diagram showing a fourth embodiment of the invention.
Figure 8:
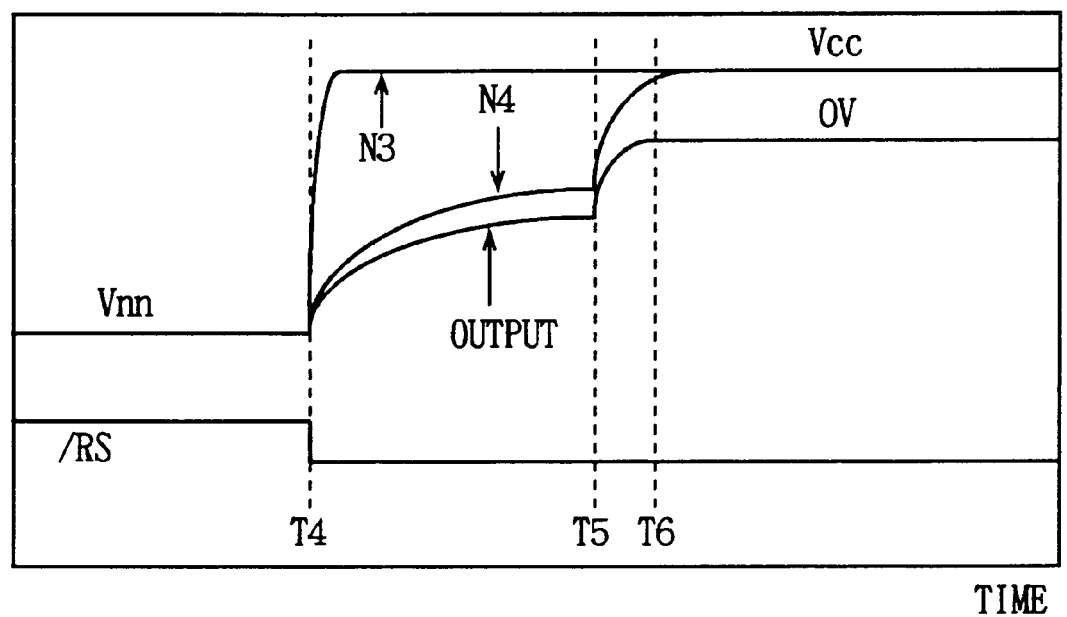
FIG. 8 shows potential change during operation of the fourth embodiment.

FIG. 7 is a schematic block diagram showing a structure of a negative high voltage generating circuit 201 of a fourth embodiment of the invention. FIG. 8 shows voltage changes during resetting.

The second embodiment is constructed to flow the discharge current during resetting while applying a relatively large voltage to P-channel MOSFET tp0, N-channel MOSFET tn1 and N-channel MOSFET tn2. In order to avoid application of a large voltage across the source and drain of the turned-on transistor, as is done in the first embodiment, the circuitry in FIG. 7 employs a resistor R2 interposed between P-channel MOSFET tp0 and N-channel MOSFET tn2.

When reset is to be done (i.e., signal /RS is at "L" level), P-channel MOSFET tp0 is turned on to raise the potential of node N3 to $V_{cc}$. Owing to provision of resistor R2, the potential of node N3 instantaneously attains $V_{cc}$. The potential of node N4 gradually rises owing to provision of resistor R2 and P-channel MOSFET tp0, so that output $V_{nn}$ gradually rises.

At this time, a potential difference between $V_{nn}$ and N4 is set to a very small value which is not higher than the threshold voltage of N-channel MOSFET tn1. Therefore, while N-channel MOSFET tn2 is on, N-channel MOSFET tn1 is off. This corresponds to a period between T4 and T5 in FIG. 8.

When $V_{nn}$ changes to a value near the ground level, N-channel MOSFET tn2 starts to be turned off. Therefore, node N4 is charged via a path including P-channel MOSFET tp0 and resistor R2, and is raised to $V_{cc}$.

Thereby, N-channel MOSFET tn1 is sufficiently turned on to supply the ground level to the output.

According to the method described above, a high voltage is not applied across the source and drain of the turned-on transistor during the reset operation, and thus resetting can be performed stably and reliably.

Figure 9:
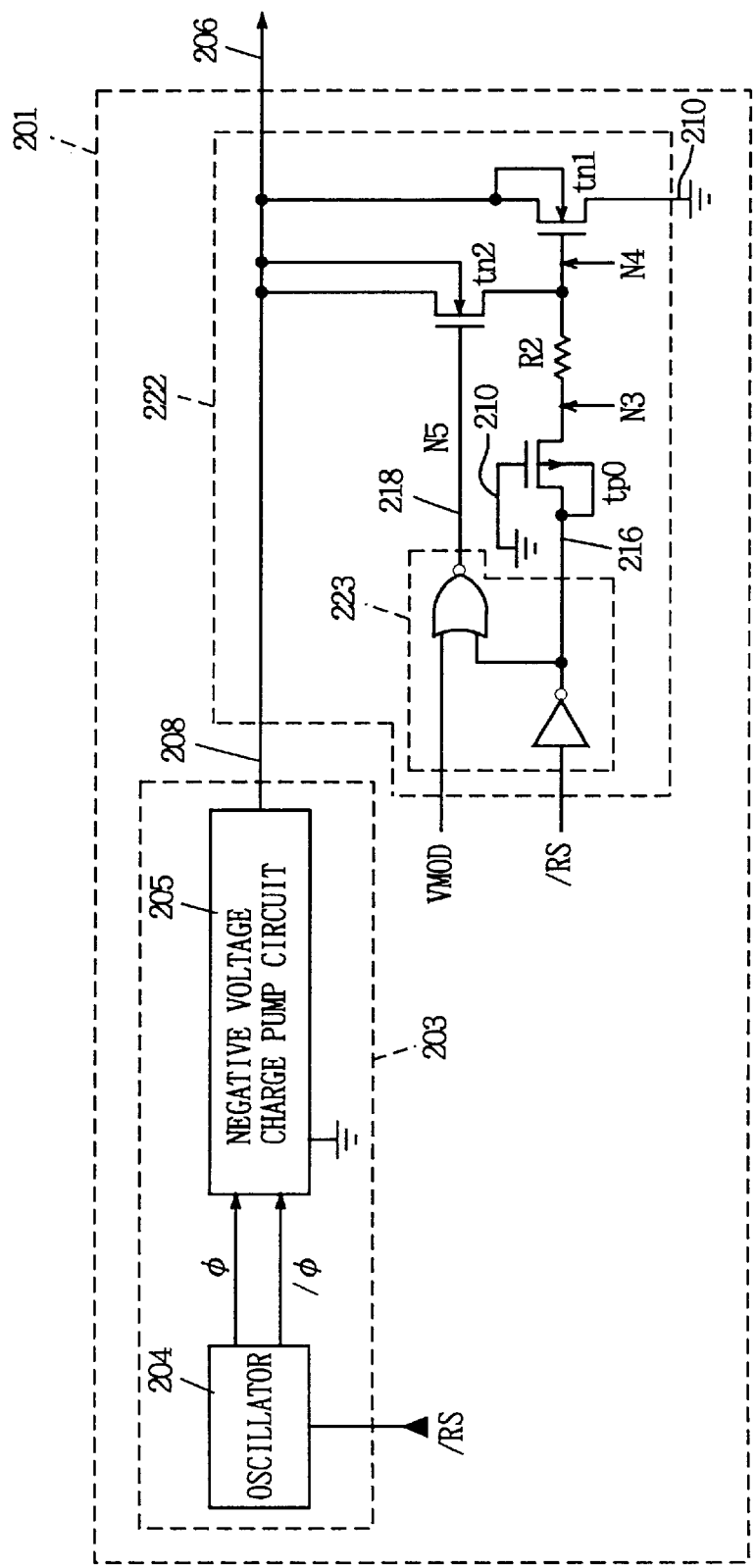
FIG. 9 is a schematic block diagram showing a fifth embodiment of the invention.

FIG. 9 is a schematic block diagram showing a structure of a negative high voltage generating circuit 201 of a fifth embodiment of the invention.

Figure 10:
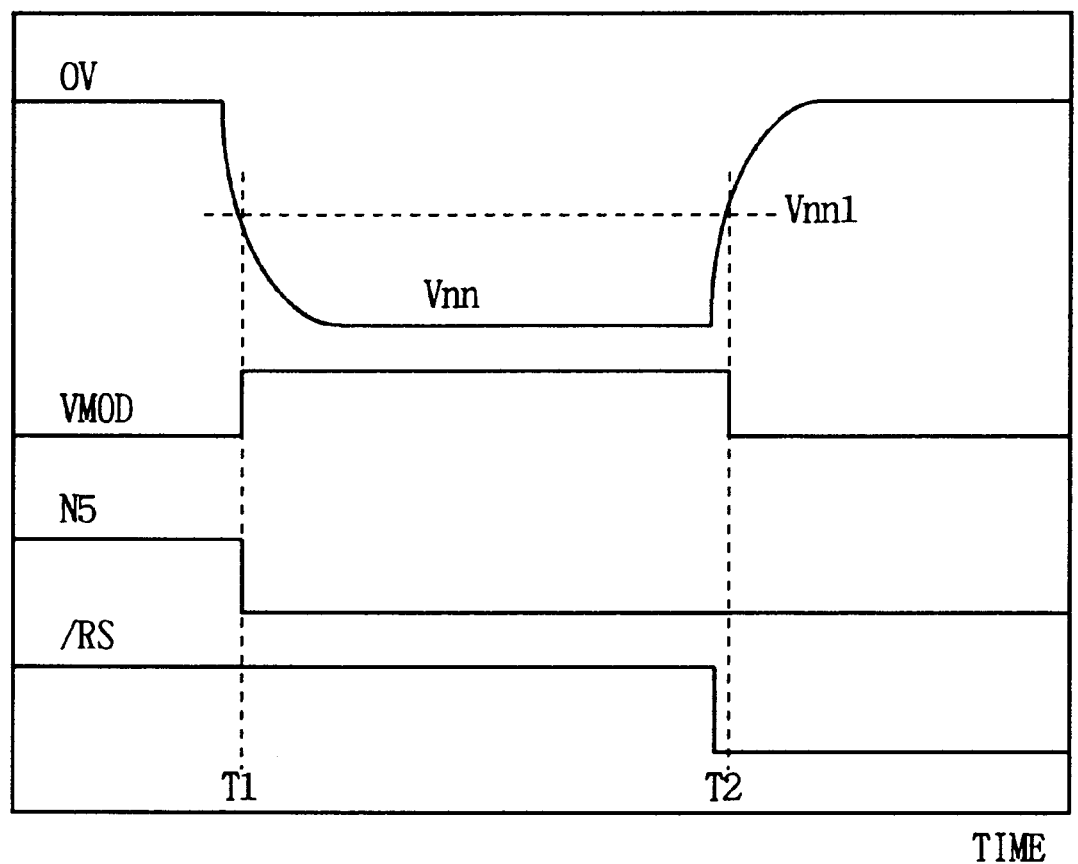
FIG. 10 shows potential change during operation of the fifth embodiment.

FIG. 10 shows voltage changes during resetting.

In the fourth embodiment, although a high voltage is not applied across the source and drain of the turned-on transistor, $V_{cc}$ is applied to the gate of N-channel MOSFET tn2 while $V_{nn}$ is being generated, and $V_{nn}$ is applied to the source, drain and channel thereof (during this, N-channel MOSFET tn2 is on).

Therefore, an excessively large stress is applied to a gate oxide layer of N-channel MOSFET tn2, which reduces reliability.

Accordingly, this embodiment utilizes a signal (VMOD) which changes its logic when the output of charge pump reaches a predetermined level ($V_{nn1}$) as shown in FIGS. 9 and 10. In an internal control signal generating circuit 223 in FIG. 9, signal VMOD is supplied to one of the input terminals of an NOR circuit. Therefore, when the output of charge pump reaches a sufficient negative voltage and signal VMOD attains "H" level, a potential of a node N5 which is an output of the NOR circuit attains "L" level regardless of the state of signal /RS, so that the gate voltage stress of N-channel MOSFET tn2 is relieved.

Figure 11:
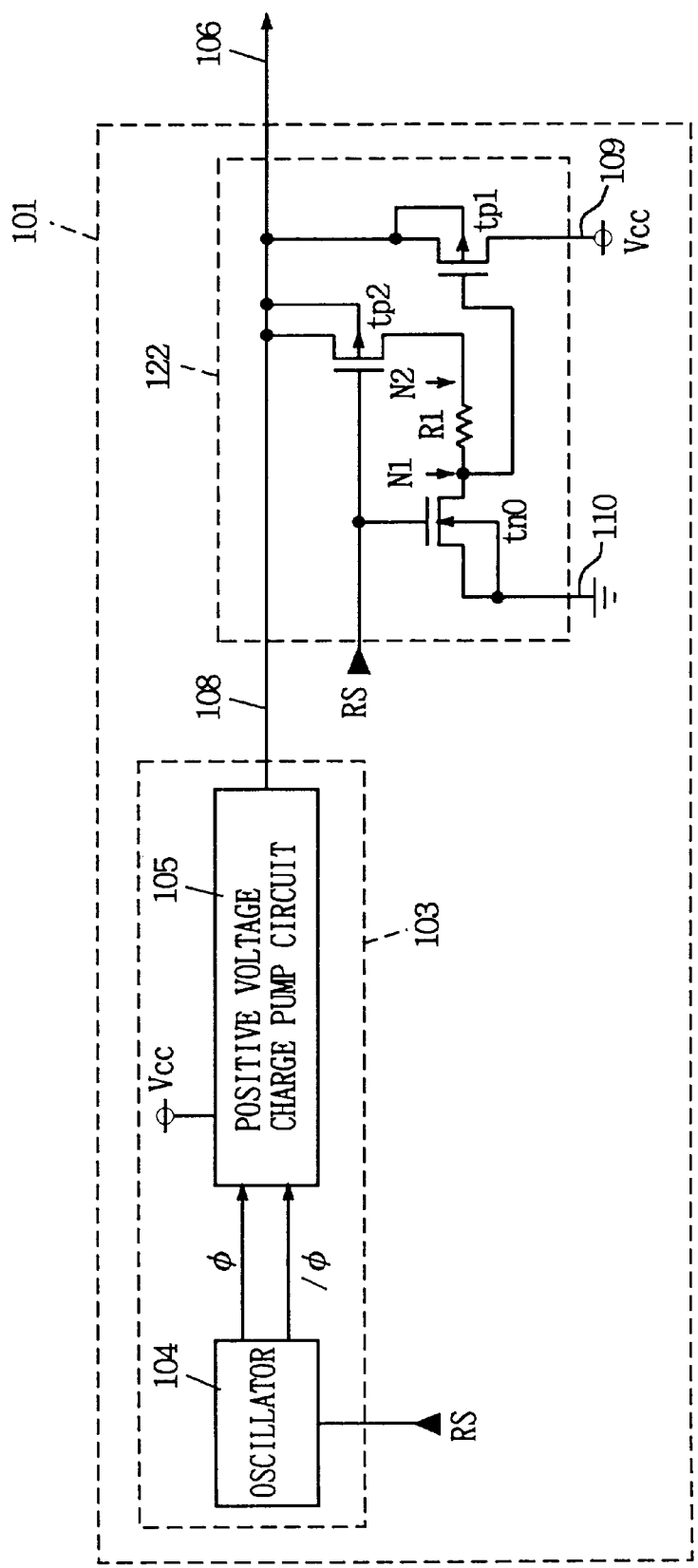
FIG. 11 is a schematic block diagram showing a sixth embodiment of the invention.

FIG. 11 is a schematic block diagram showing a structure of a positive high voltage generating circuit 101 of a sixth embodiment of the invention.

Figure 12:
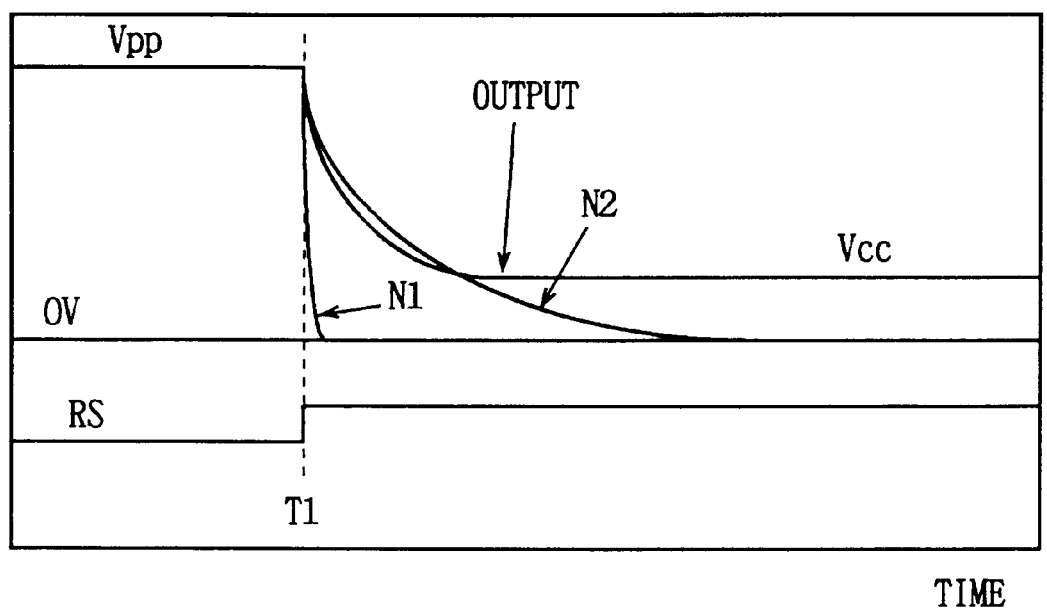
FIG. 12 shows potential change during operation of the sixth embodiment.

FIG. 12 shows voltage changes during resetting.

In the third embodiment, since the resetting of output voltage $V_{pp}$ is performed through resistor R1, a very long time is required for discharging the output.

In order to improve the above, a circuit structure shown in FIG. 11 is employed. That is; node N1 is directly supplied to the gate of P-channel MOSFET tp1, whereby the output is reset to $V_{cc}$ through P-channel MOSFET tp1.

A potential difference between the source and drain of P-channel MOSFET tp1 is $V_{pp}$-$V_{cc}$ and hence is relatively small, so that a breakdown voltage in the on state does not cause a significant problem.

Therefore, resistor R1 can be interposed between P-channel MOSFET tp2 and N-channel MOSFET tn0, between which a large potential is generated during resetting.

As shown in FIG. 12, the gate of P-channel MOSFET tp1 is discharged through a path not including the resistor, so that the potential of node N2 reaches the ground level more rapidly than the structure in FIG. 6. Therefore, the time required for resetting the output is reduced.

Figure 13:
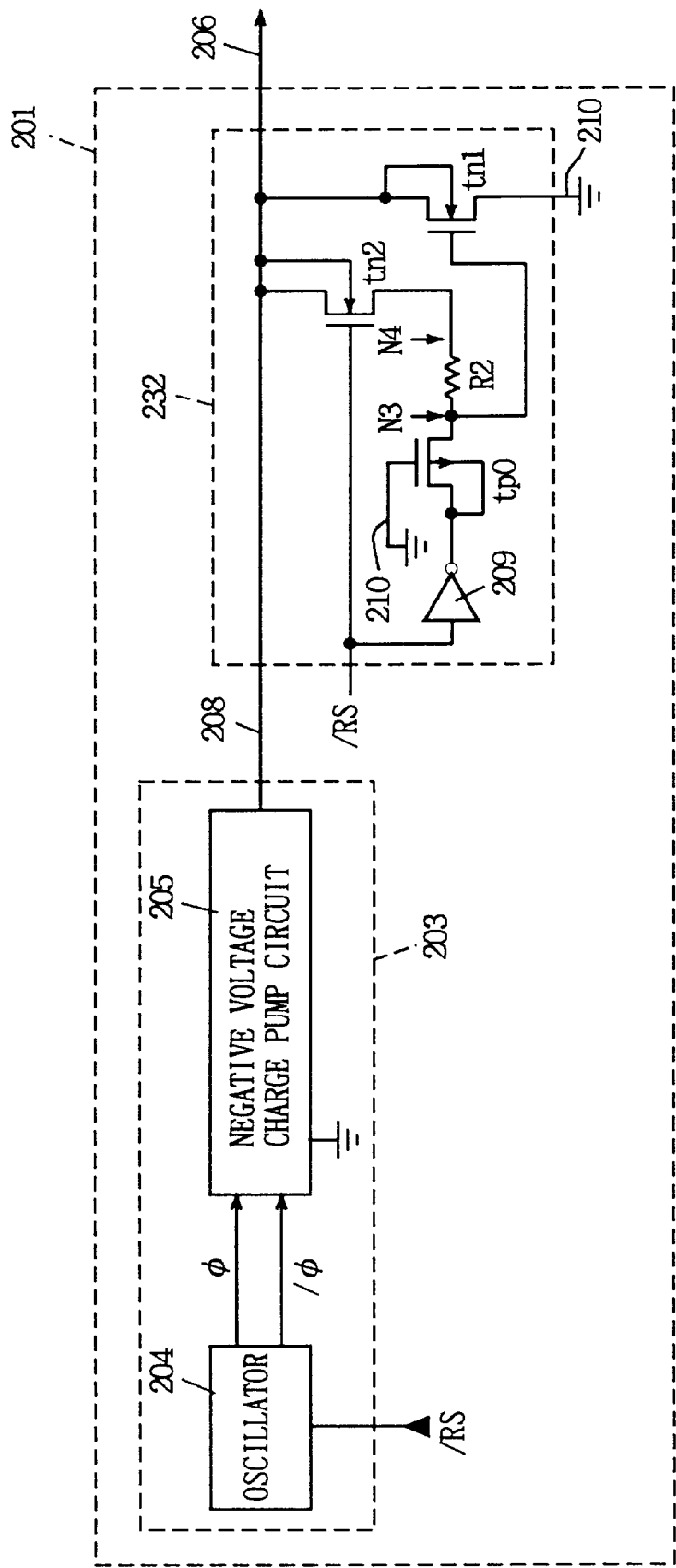
FIG. 13 is a schematic block diagram showing a seventh embodiment of the invention.

FIG. 13 is a schematic block diagram showing a structure of a negative high voltage generating circuit 201 of a seventh embodiment of the invention.

Figure 14:
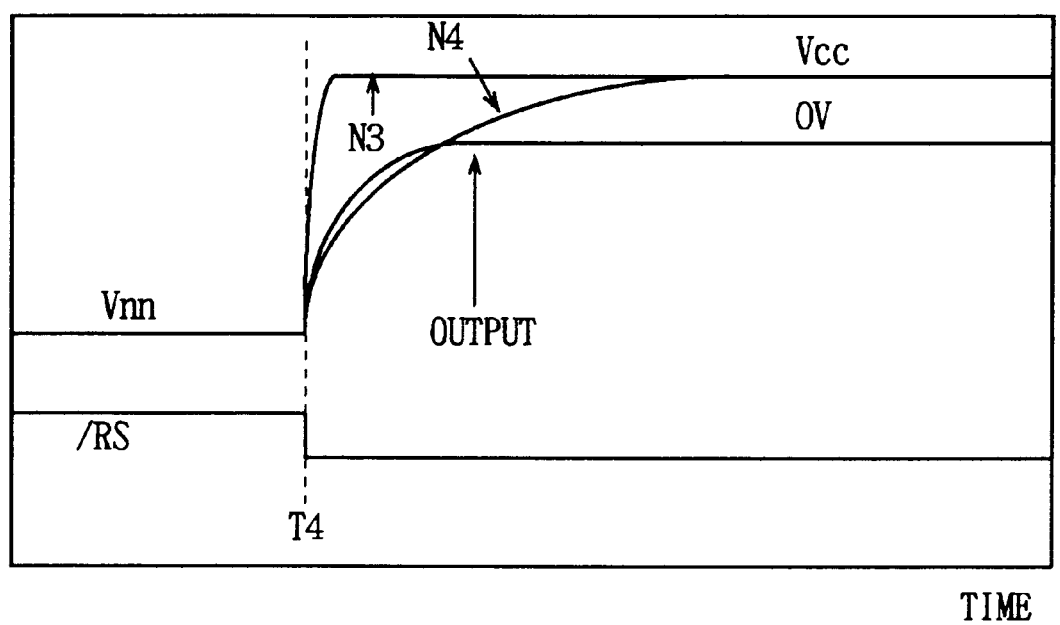
FIG. 14 shows potential change during operation of the seventh embodiment.

FIG. 14 shows voltage changes during resetting.

In the fourth embodiment, since the $V_{nn}$ is reset through resistor R2, charging of the output requires a very long time. In order to improve this, a circuit structure shown in FIG. 13 is employed.

Thus, node N3 is directly input to the gate of N-channel MOSFET tn1, whereby the output is reset to the ground level through N-channel MOSFET tn1.

A potential difference between the source and drain of N-channel MOSFET tn1 is $V_{nn}$ and hence is relatively small, so that a breakdown voltage in the on state does not cause a significant problem. Therefore, resistor R2 can be interposed between N-channel MOSFET tn2 and P-channel MOSFET tp0, between which a large potential is generated during resetting.

As can be seen in FIG. 14, as compared to FIG. 8, the potential of resetting node N4 of FIG. 13 reaches the ground level more rapidly than the structure of FIG. 7 since the gate of N-channel MOSFET tn1 of FIG. 13 is discharged through a path not including the resistor. Therefore, the time required for resetting the output is reduced.

Furthermore, in order to reduce the stress applied to the gate oxide layer of N-channel MOSFET tn2, this seventh embodiment can be modified in the same manner as the fifth embodiment shown in FIG. 9.

Figure 15:
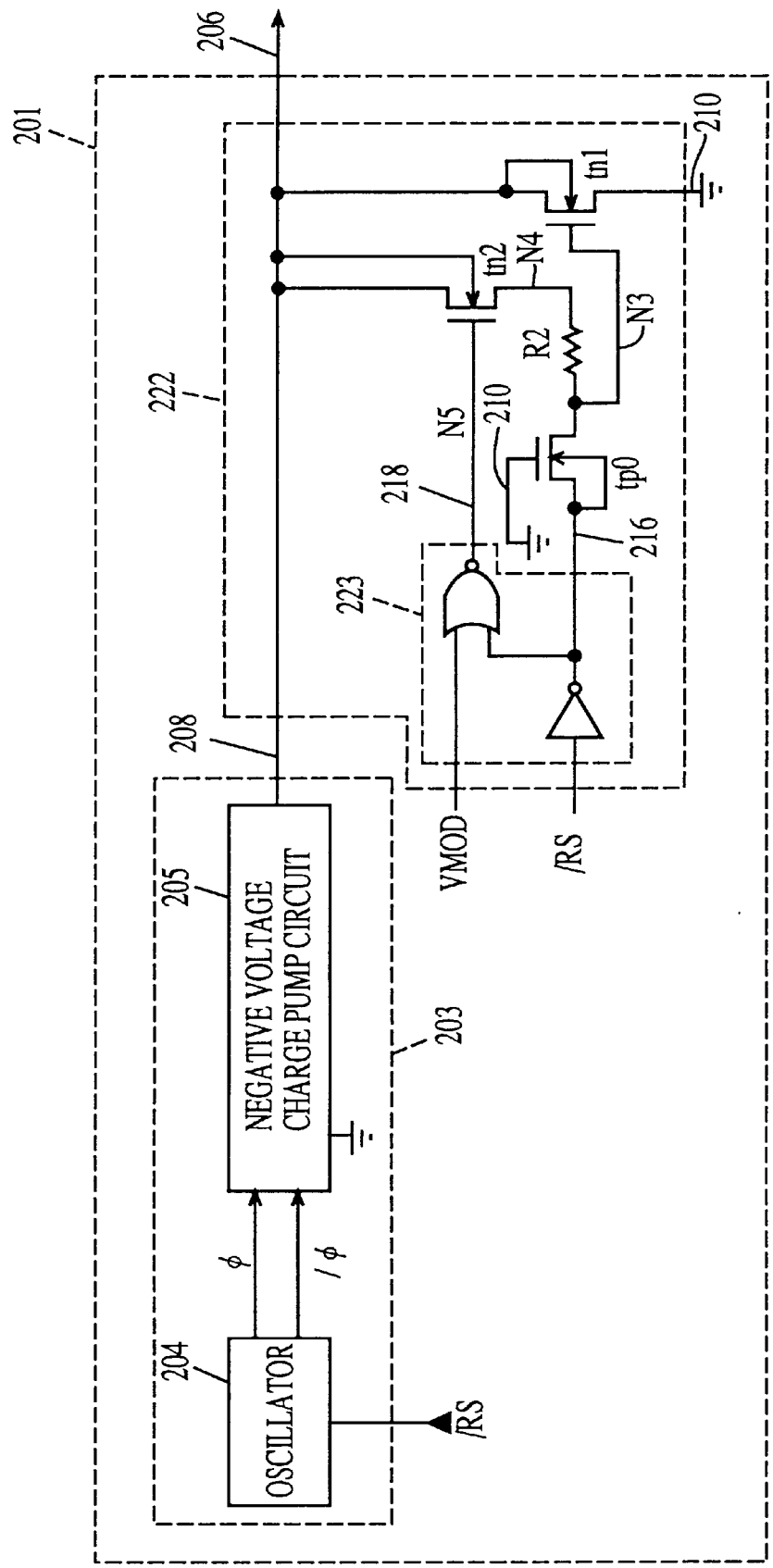
FIG. 15 is a schematic block diagram showing a modification of seventh embodiment of the invention.

FIG. 15 is a schematic block diagram showing a modification of the seventh embodiment.

As the fifth embodiment, this modification utilizes a signal (VMOD) which changes its logic when the output of charge pump reaches a predetermined level ($V_{nn1}$) as shown in FIG. 10. In an internal control signal generating circuit 223 in FIG. 15, signal VMOD is supplied to one of the input terminals of an NOR circuit. Therefore, when the output of charge pump reaches a sufficient negative voltage and signal VMOD attains "H" level, a potential of a node N5 which is an output of the NOR circuit attains "L" level regardless of the state of signal /RS, so that the gate voltage stress of N-channel MOSFET tn2 is relieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reset circuit being supplied with a first power supply potential, a second power supply potential higher than said first power supply potential and a third power supply potential higher than said second power supply potential, and switching a state of outputting said third power supply potential to an output node to a state of outputting said second power supply potential in response to a control signal switchable between potentials at first and second signal levels, comprising:

a first input node supplied with said first power supply potential;

a second input node supplied with said second power supply potential;

an internal node selectively coupled and decoupled with said third power supply potential in accordance with said control signal;

a control circuit selectively connecting said first power supply potential and said third power supply potential to said internal node in accordance with the potential level of said control signal; and a first P-channel MOSFET receiving on its gate the potential level of said internal node and connected at its drain to said second input node, the output node being selectively connected to said internal node as well as being connected to a source and a back gate of said first P-channel MOSFET.

2. The reset circuit according to claim 1, wherein said control circuit includes:

a second P-channel MOSFET receiving on its gate said control signal, connected at its source and back gate to said output node and connected at its drain to the gate of said first P-channel MOSFET; and an N-channel MOSFET receiving on its gate said control signal, connected at its source and back gate to said first input node and connected at its drain to the drain of said second P-channel MOSFET.

3. The reset circuit according to claim 2, wherein the drain of said N-channel MOSFET is connected to the gate of said first P-channel MOSFET with a resistor therebetween.

4. The reset circuit according to claim 2, wherein the drain of said second P-channel MOSFET is connected to the gate of said first P-channel MOSFET with a resistor therebetween.

5. The reset circuit according to claim 1, further comprising:

a supply unit for supplying said third power supply potential, said supply unit including an oscillator circuit generating mutually complementary first and second clock signals, and a charge pump circuit receiving said first and second clock signals and generating the third power supply potential;

said oscillator circuit being switched between an operating state and a stopped state by said control signal, said control circuit connecting the first power supply potential to the internal node when the oscillator is in the stopped state, and connecting the third power supply potential to the internal node when the oscillator is in the operating state.

6. The reset circuit according to claim 1, wherein said reset circuit is mounted on a semiconductor device supplied with a single external power supply potential, and said first power supply potential and said second power supply potential correspond to a ground potential and said external power supply potential of said semiconductor device, respectively.

7. The reset circuit according to claim 6, wherein said semiconductor device is a flash memory.

8. The reset circuit according to claim 1, wherein said control circuit includes:
a second P-channel MOSFET receiving on its gate said control signal, connected at its source and back gate to said output node and connected at its drain to the gate of said first P-channel MOSFET;
a resistor connected at its one end to the drain of said second P-channel MOSFET; and
an N-channel MOSFET receiving on its gate said control signal, connected at its source and back gate to said first input node and connected at its drain to the other end of said resistor.

9. The reset circuit according to claim 1, wherein said control circuit includes:
a second P-channel MOSFET receiving on its gate said control signal, and connected at its source and back gate to said output node;
a resistor connected at its one end to a drain of said second P-channel MOSFET and connected at the other end to the gate of said first P-channel MOSFET; and
an N-channel MOSFET receiving on its gate said control signal, connected at its source and back gate to said first input node and connected at its drain to the other end of said resistor.

10. A reset circuit being supplied with a first power supply potential, a second power supply potential higher than said first power supply potential and a third power supply potential of a negative value lower than said first power supply potential, and switching a state of outputting said third power supply potential to an output node to a state of outputting said first power supply potential in accordance with a control signal switchable between potentials at first and second signal levels, comprising:
a first input node supplied with said first power supply potential;
an internal node selectively coupled and decoupled with said third power supply potential in accordance with said control signal;
a control circuit selectively connecting said second power supply potential and said third power supply potential to said internal node in accordance with the potential level of said control signal; and
a first N-channel MOSFET receiving on its gate the potential level of said internal node, and connected at its source to said first input node,
the output node being selectively connected to said internal node as well as being connected to a drain and a back gate of said first N-channel MOSFET.

11. The reset circuit according to claim 10, wherein said control circuit includes:
a second N-channel MOSFET receiving on its gate said control signal, connected at its source and back gate to said output node and connected at its drain to the gate of said first N-channel MOSFET;
a P-channel MOSFET connected at its gate to said first input node and connected at its drain to the drain of said second N-channel MOSFET; and
an inverter circuit receiving said control signal, and connected at its output to a source and a back gate of said P-channel MOSFET.

12. The reset circuit according to claim 10, further comprising:
a supply unit for supplying said third power supply potential, said supply unit including
an oscillator circuit generating mutually complementary first and second clock signals, and
a charge pump circuit receiving said first and second clock signals and generating the third power supply potential;
said oscillator circuit being switched between an operating state and a stopped state by said control signal, said control circuit connecting the second power supply potential to the internal node when the oscillator circuit attains the stopped state, and connecting the third power supply potential to the internal node when the oscillator circuit attains the operating state.

13. The reset circuit according to claim 10, wherein
said reset circuit is mounted on a semiconductor device supplied with an external power supply potential, wherein said external power supply potential is said first power supply potential which corresponds to a ground potential.

14. The reset circuit according to claim 13, wherein said semiconductor device is a flash memory.

15. The reset circuit according to claim 10, wherein said control circuit includes:
a second N-channel MOSFET receiving on its gate said control signal, connected at its source and back gate to said output node and connected at its drain to the gate of said first N-channel MOSFET;
a resistor connected at its one end to the drain of said second N-channel MOSFET;
a P-channel MOSFET connected at its gate to said first input node and connected at its drain to the other end of said resistor; and
an inverter circuit receiving said control signal and connected at its output to a source and a back gate of said P-channel MOSFET.

16. The reset circuit according to claim 10, wherein said control circuit includes an internal control signal generating circuit;
said internal control signal generating circuit includes:
an inverter inverting said control signal,
a first output node coupled to an output of said inverter, and
a second output node outputting said control signal when the potential of the output node of said reset circuit is not lower than a predetermined value, and outputting said first power supply potential regardless of said control signal when the potential of the output node of said reset circuit is lower than the predetermined value;
said control circuit further includes:
a second N-channel MOSFET connected at its gate to said second output node of said internal control signal generating circuit, connected at its source and back gate to said output node of said reset circuit and connected at its drain to the gate of said first N-channel MOSFET,
a resistor connected at its one end to the drain of said second N-channel MOSFET, and
a P-channel MOSFET connected at its gate to said first input node of said reset circuit, connected at its drain to the other end of said resistor, and connected at its source and back gate to said first output node of said internal control signal generating circuit.

17. The reset circuit according to claim 10, wherein said control circuit includes;

a second N-channel MOSFET receiving on its gate said control signal, and connected at its source and back gate to said output node;

a resistor connected at its one end to a drain of said second N-channel MOSFET and connected at its other end to the gate of said first N-channel MOSFET;

a P-channel MOSFET connected at its gate to said first input node and connected at its drain to the other end of said resistor; and an inverter circuit receiving said control signal, and connected at its output to a source and a back gate of said P-channel MOSFET.

18. The reset circuit according to claim 10, wherein said control circuit includes an internal control signal generating circuit;

said internal control signal generating circuit includes:
an inverter inverting said control signal,
a first output node coupled to an output of said inverter, and
a second output node outputting said control signal when the potential of the output node of said reset circuit is not lower than a predetermined value, and outputting said first power supply potential regardless of said control signal when the potential of the output node of said reset circuit is lower than the predetermined value;

said control circuit further includes:
a second N-channel MOSFET connected at its gate to said second output node of said internal control signal generating circuit and connected at its source and back gate to said output node of said reset circuit,
a resistor connected at its one end to the drain of said second N-channel MOSFET, and
a P-channel MOSFET connected at its gate to said first input node of said reset circuit, connected at its drain to the other end of said resistor and the gate of said first N-channel MOSFET, and connected at its source and back gate to said first output node of said internal control signal generating circuit.

19. The reset circuit according to claim 10, wherein said control circuit includes:
a second N-channel MOSFET coupled between said output node and said internal node, for supplying said third power supply potential to said internal node in response to said control signal being the first level; and
a P-channel MOSFET having a drain coupled to said internal node, for supplying said second power supply potential to said internal node in response to said control signal being the second level.

20. The reset circuit according to claim 19, wherein said second N-channel MOSFET has a gate receiving said control signal,
said P-channel MOSFET has a gate coupled to said first input node; and
said control circuit further includes
an inverter circuit receiving said control signal and having an output coupled to a source and a back gate of said P-channel MOSFET.

21. The reset circuit according to claim 20, wherein the drain of said P-channel MOSFET is connected to said internal node with a resistor therebetween.

22. The reset circuit according to claim 20, wherein the drain of said second N-channel MOSFET is connected to said internal node with a resistor therebetween.

23. The reset circuit according to claim 19, wherein said control circuit includes
an internal control signal generating circuit for rendering said second N-channel MOSFET nonconductive in independence of said control signal when the potential of said output node is lower than a predetermined value.

24. The reset circuit according to claim 23, wherein the drain of said P-channel MOSFET is connected to said internal node with a resistor therebetween.

25. The reset circuit according to claim 23, wherein the drain of said second N-channel MOSFET is connected to said internal node with a resistor therebetween.

* * * * *